(12) United States Patent
Yi et al.

(10) Patent No.: US 12,527,173 B2
(45) Date of Patent: Jan. 13, 2026

(54) DISPLAY SUBSTRATE HAVING PLANARIZATION LAYER COVERING SPACING REGION BETWEEN SIGNAL LINES, MANUFACTURING METHOD THEREOF AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hong Yi, Beijing (CN); Tiaomei Zhang, Beijing (CN); Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 764 days.

(21) Appl. No.: 17/782,979

(22) PCT Filed: Jun. 25, 2021

(86) PCT No.: PCT/CN2021/102252
§ 371 (c)(1),
(2) Date: Jun. 6, 2022

(87) PCT Pub. No.: WO2022/266980
PCT Pub. Date: Dec. 29, 2022

(65) Prior Publication Data
US 2024/0179967 A1    May 30, 2024

(51) Int. Cl.
*H10K 59/131* (2023.01)
*H10K 59/12* (2023.01)
*H10K 59/124* (2023.01)

(52) U.S. Cl.
CPC ....... *H10K 59/131* (2023.02); *H10K 59/1201* (2023.02); *H10K 59/124* (2023.02)

(58) Field of Classification Search
CPC ............. H10K 59/131; H10K 59/1201; H10K 59/124; H01L 27/124
(Continued)

(56) References Cited

U.S. PATENT DOCUMENTS

| 2005/0184927 A1* | 8/2005 | Kwak | H10D 86/441 345/45 |
| 2015/0303245 A1* | 10/2015 | Kashiwabara | H10K 59/124 438/34 |

(Continued)

FOREIGN PATENT DOCUMENTS

| CN | 104952882 A | 9/2015 |
| CN | 109710103 A | 5/2019 |

(Continued)

*Primary Examiner* — Duy T Nguyen
(74) *Attorney, Agent, or Firm* — BROOKS KUSHMAN P.C.

(57) ABSTRACT

Display substrate, manufacturing method thereof and display apparatus are provided. The display substrate includes display and periphery areas, and further includes: first and second signal lines, first and second planarization layers, where each of first and second signal lines is located at periphery area, and includes portion extending in first direction; at least part of first signal line is located between display area and second signal line, first spacing region is provided between projection of first signal line onto base of display substrate and projection of second signal line onto base; first planarization portion including first planarization portion located at periphery area; second planarization layer including first via hole, projection of which onto base overlaps with first spacing region at first overlap region; and (Continued)

projection of first planarization portion onto base overlaps with first overlap region at second overlap region.

18 Claims, 12 Drawing Sheets

(58) Field of Classification Search
USPC .......................................................... 257/91
See application file for complete search history.

(56) References Cited

U.S. PATENT DOCUMENTS

| | | |
|---|---|---|
| 2015/0357396 A1* | 12/2015 | Han .................. H10K 59/00 257/40 |
| 2019/0121479 A1 | 4/2019 | Lee |
| 2019/0341572 A1 | 11/2019 | Lee et al. |
| 2021/0091152 A1 | 3/2021 | Yang et al. |
| 2021/0135153 A1 | 5/2021 | Zhang et al. |

FOREIGN PATENT DOCUMENTS

| | | | |
|---|---|---|---|
| CN | 109817577 A | | 5/2019 |
| CN | 110610975 A | | 12/2019 |
| CN | 111430421 A | | 7/2020 |
| CN | 111880344 A | | 11/2020 |
| CN | 112310180 A | | 2/2021 |
| JP | 2020177933 A | | 10/2020 |
| KR | 20200137071 A | * | 12/2020 |

* cited by examiner

DISPLAY SUBSTRATE HAVING PLANARIZATION LAYER COVERING SPACING REGION BETWEEN SIGNAL LINES, MANUFACTURING METHOD THEREOF AND DISPLAY APPARATUS

CROSS-REFERENCE TO RELATED APPLICATION

This application is the U.S. national phase of PCT Application No. PCT/CN2021/102252 filed on Jun. 25, 2021, which is incorporated herein by reference in its entirety.

TECHNICAL FIELD

The present disclosure relates to the technical field of display, and in particular, to a display substrate, a manufacturing method thereof and a display apparatus.

BACKGROUND

With continuous developing of display technology, the organic light emitting diode (English: Organic Light Emitting Diode, hereinafter referred to as: OLED) display becomes one of hot spots in the research field of flat panel display. A growing number of display panels with active-matrix organic light emitting diodes (English: Active-Matrix Organic Light Emitting Diode, hereinafter referred to as: AMOLED) enter the market. Compared with traditional thin-film transistor liquid crystal display panel (English: Thin Film Transistor Liquid Crystal Display, hereinafter referred to as: TFT LCD), the AMOLED display has a faster reaction speed, a higher contrast ratio and a broader angle of view. Furthermore, with the developing of display technology, a flexible bendable OLED display screen, which is light and thin and shows a good anti-impact performance, are widely used in electronic devices.

SUMMARY

The present disclosure is to provide a display substrate, a manufacturing method thereof and a display apparatus.

To achieve this, the present disclosure provides the following technical solutions, In a first aspect of the present disclosure, a display substrate is provided, including a display area and a periphery area surrounding the display area; the display substrate further including:
  a first signal line, the first signal line located at the periphery area, the first signal line including a portion extending in a first direction;
  a second signal line, the second signal line located at the periphery area, the second signal line including a portion extending in the first direction, at least a portion of the first signal line being located between the display area and the second signal line, where a first spacing region is provided between an orthographic projection of the first signal line on a base of the display substrate and an orthographic projection of the second signal line onto the base;
  a first planarization layer, the first planarization layer including a first planarization portion located at the periphery area; and
  a second planarization layer, the second planarization layer including a first via hole, an orthographic projection of the first via hole onto the base overlaps with the first spacing region at a first overlap region; and an orthographic projection of the first planarization portion onto the base overlaps with the first overlap region at a second overlap region Alternatively, the first overlap region is located inside the orthographic projection of the first planarization portion onto the base.

Alternatively, the orthographic projection of the first planarization portion onto the base at least partially overlaps with the orthographic projection of the first signal line onto the base; and
  a second spacing region is provided between the orthographic projection of the first planarization portion onto the base and the orthographic projection of the second signal line onto the base.

Alternatively, a width d of the second spacing region in a direction perpendicular to the first direction satisfies: 8 µm≤d≤12 µm.

Alternatively, the display substrate further includes:
  a cathode layer, at least a portion of the cathode layer being located in the display area;
  an electrically conductive connecting layer, the electrically conductive connecting layer extending from the display area to the periphery area, the electrically conductive connecting layer being coupled to the cathode layer and the second signal line; where an orthographic projection of the electrically conductive connecting layer onto the base at least partially overlaps with the second overlap region.

Alternatively, the second planarization layer further includes a plurality of second via holes arranged in an array, the electrically conductive connecting layer coupled to the second signal line through the plurality of second via holes.

Alternatively, the display substrate further includes an anode layer, and the electrically conductive connecting layer and the anode layer are arranged in the same layer and formed of the same material.

Alternatively, the display substrate further includes an encapsulation layer, at least a portion of the encapsulation layer is located at a side of the cathode layer facing away from the base, and the encapsulation layer covers the second overlap region.

Alternatively, the display substrate further includes:
  a plurality of fan-out lines, the plurality of fan-out lines being located at the periphery area, and an orthographic projection of at least a part of the fan-out lines onto the base overlapping with the second overlap region.

Alternatively, the first signal line comprises a first transmission portion and a second transmission portion coupled with each other, the first transmission portion extends in the first direction, at least a portion of the second transmission portion extends in a second direction, the second direction intersects with the first direction; and
  the second signal line comprises a third transmission portion and a fourth transmission portion coupled with each other, the third transmission portion extends in the first direction, at least a portion of the fourth transmission portion extends in the second direction, the fourth transmission portion and the second transmission portion are arranged along the first direction, the first spacing region is provided between an orthographic projection of the first transmission portion onto the base and an orthographic projection of the third transmission portion onto the base.

Alternatively, the first transmission portion includes a first transmission pattern and a second transmission pattern coupled with each other, the first transmission pattern being located between the base and the second transmission pattern; and the third transmission portion includes a third transmission pattern and a fourth transmission pattern coupled with each other, the third transmission pattern is located between the base and the fourth transmission pattern, the first spacing region is provided between an orthographic projection of the second transmission pattern onto the base and an orthographic projection of the fourth transmission pattern onto the base.

Alternatively, the display substrate further includes a first source-drain metal layer and a second source-drain metal layer, the first source-drain metal layer is located between the base and the second source-drain metal layer; and the first transmission pattern and the third transmission pattern are arranged in the same layer and formed by the same material as the first source-drain metal layer; the second transmission pattern and the fourth transmission pattern are arranged in the same layer and formed by the same material as the second source-drain metal layer.

Alternatively, the second transmission portion includes a fifth transmission pattern and a sixth transmission pattern that are stacked one on another, the fifth transmission pattern and the first transmission pattern are formed as an integral structure, a fourth spacing region is provided between the sixth transmission pattern and the second transmission pattern, and an orthographic projection of the fourth spacing region onto the base at least partially overlaps with an orthographic projection of a first border of the first planarization portion facing towards the third transmission portion onto the base.

Alternatively, the display substrate further includes:

a third signal line located at the periphery area; the third signal line comprises a fifth transmission portion and a sixth transmission portion coupled with each other, the fifth transmission portion extends in the first direction, and at least a portion of the sixth transmission portion extends in the second direction; the sixth transmission portion and the second transmission portion are arranged along the first direction; and the orthographic projection of the first border of the first planarization portion facing towards the third transmission portion onto the base overlaps with an orthographic projection of the second transmission portion onto the base and an orthographic projection of the sixth transmission portion onto the base.

Alternatively, the sixth transmission portion includes a seventh transmission pattern, the seventh transmission pattern and the second transmission pattern are arranged in different layers.

Alternatively, the sixth transmission portion includes an eighth transmission pattern, the eighth transmission pattern is coupled to the seventh transmission pattern, and the eighth transmission pattern is arranged in the same layer and formed by the same material as the first transmission pattern.

Alternatively, the first signal line includes a positive power supply line, the second signal line includes a negative power supply line, and the third signal line includes an initialization signal line.

Based on the technical solution of the above-mentioned display substrate, in a second aspect of the present disclosure, a display apparatus is provided, including the above-mentioned display substrate.

Based on the technical solution of the above-mentioned display substrate, in a third aspect of the present disclosure, a method of manufacturing the display substrate is provided, the display substrate including a display area and a periphery area surrounding the display area; the manufacturing method including:

manufacturing a first signal line, the first signal line located at the periphery area, the first signal line including a portion extending in a first direction;

manufacturing a second signal line, the second signal line located at the periphery area, the second signal line including a portion extending in the first direction, at least a portion of the first signal line being located between the display area and the second signal line, a first spacing region being provided between an orthographic projection of the first signal line onto a base of the display substrate and an orthographic projection of the second signal line onto the base;

manufacturing a first planarization layer, the first planarization layer including a first planarization portion located at the periphery area; and manufacturing a second planarization layer, the second planarization layer including a first via hole, an orthographic projection of the first via hole onto the base overlaps with the first spacing region at a first overlap region; an orthographic projection of the first planarization portion onto the base overlaps with the first overlap region at a second overlap region.

BRIEF DESCRIPTION OF THE DRAWINGS

The accompanying drawings illustrated herein are to provide a further understanding of the disclosure and constitute a part of this disclosure. Exemplary embodiments of the disclosure and the description there for are to explain the disclosure and do not constitute an undue limitation of the disclosure. In the drawings.

DETAILED DESCRIPTION

To further illustrate display substrate, manufacturing method thereof and display apparatus provided by embodiments of the present disclosure, the detailed description is illustrated in conjunction with the accompanying drawings hereinafter.

The present disclosure provides a display substrate, including a display area and a periphery area surrounding the display area. The display substrate further includes a first signal line and a second signal line, both of which are located at the periphery area, there is a first spacing region is between an orthographic projection of the first signal line onto a base of the display substrate and an orthographic projection of the second signal line onto the base. The display substrate further includes a first planarization layer and a second planarization layer, and both the first planarization layer and the second planarization layer are removed at the position of the first spacing region.

Figure 7:
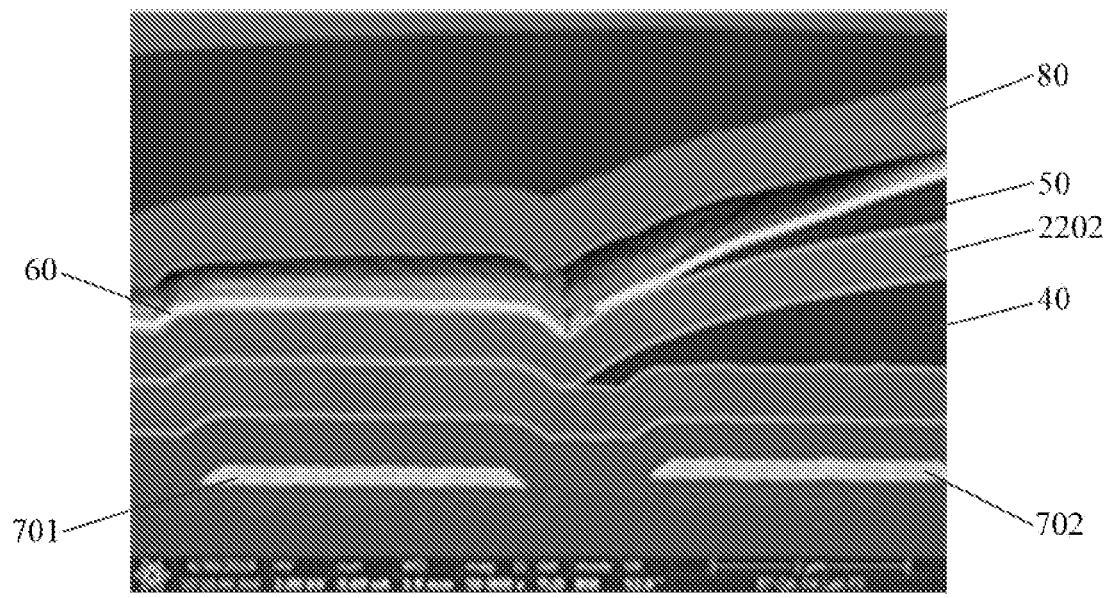
FIG. 7 is a cross-sectional schematic view of FIG. 6 taken along the direction A1A2.
Figure 8:
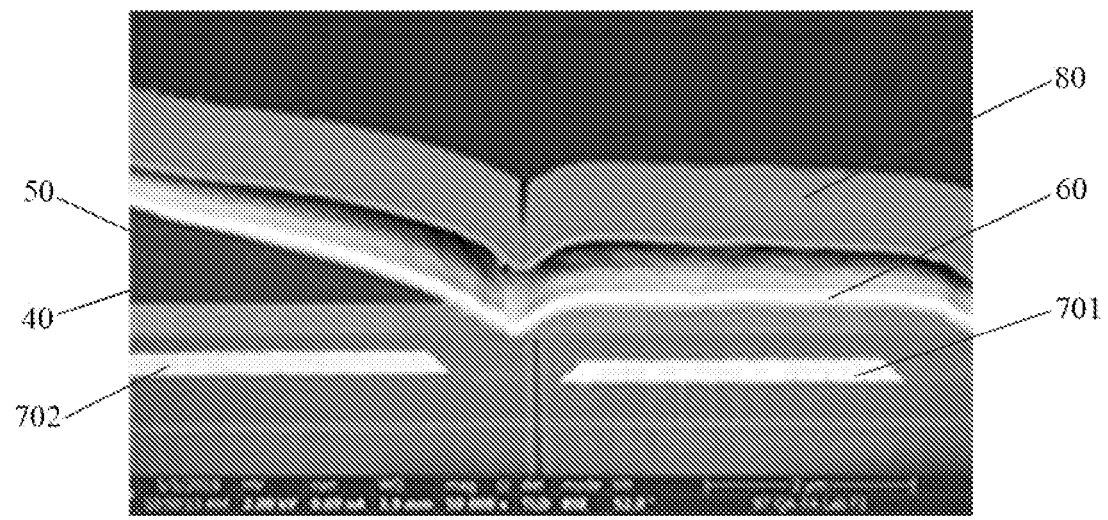
FIG. 8 is a cross-sectional schematic view of FIG. 6 taken along the direction C1C2.

As shown in FIGS. 7 and 8, in the display substrate, since both the first planarization layer and the second planarization layer at the position of the first spacing region are removed, a deep groove will be formed at the position where the first spacing region is located. As such, other functional film layers such as an encapsulation layer 80, which are formed subsequently, may be broken easily when crossing the groove due to a large segment difference at the groove, so that water vapor and oxygen in the environment may enter into an interior of the display substrate from the broken position. This will affect the service life of the display substrate and reduce the yield of the display substrate.

With reference to FIGS. 1 to 6, 10, 11 and 12, embodiments of the present disclosure provides a display substrate, including a display area 10 and a periphery area 20 surrounding the display area 10; the display substrate further includes:

a first signal line 21, the first signal line 21 is located at the periphery area 20, the first signal line 21 includes a portion extending in a first direction;

a second signal line 22, the second signal line 22 is located at the periphery area 20, the second signal line 22 includes a portion extending in the first direction, at least a portion of the first signal line 21 is located between the display area 10 and the second signal line 22, there is a first spacing region 30 between the orthographic projection of the first signal line 21 (including a first transmission portion 210) onto a base 90 of the display substrate and the orthographic projection of the second signal line 22 (including a third transmission portion 220) onto the base 90;

a first planarization layer, the first planarization layer including a first planarization portion 40 located at the periphery area 20;

a second planarization layer 50, the second planarization layer 50 including a first via hole 51, the orthographic projection of the first via hole 51 onto the base 90 and the first spacing region 30 overlaps at a first overlap region; the orthographic projection of the first planarization portion 40 onto the base 90 and the first overlap region overlaps at a second overlap region.

Illustratively, the display substrate includes the display area 10 and the periphery area 20, the display area 10 includes a rectangular structure or other structures with irregular shapes.

The display area 10 includes a rectangle is taken as an example. The periphery area 20 includes a portion near a first side of the display area 10, a portion near a second side of the display area 10, a portion near a third side of the display area 10, and a portion near a fourth side of the display area 10. The first side and the second side are opposite to each other in the first direction, and the third side and the fourth side are opposite to each other in the second direction. Illustratively, the first side includes a lower side of the display area 10, and the periphery area 20 has a driving chip arranged within a region adjacent to the first side; the second side includes an upper side of the display area 10; the third side includes a left side of the display area 10, the fourth side includes a right side of the display area 10, and a gate driving circuit is provided in a region of the periphery area 20 adjacent to the third side and a region of the periphery area 20 adjacent to the fourth side.

Illustratively, the first signal line 21 is located at the periphery area 20. Illustratively, the first signal line 21 includes a portion adjacent to the first side of the display area 10 and a portion adjacent to the second side of the display area 10.

Illustratively, the second signal line 22 is located at the periphery area 20. Illustratively, the second signal line 22 includes a portion adjacent to the first side of the display area 10 and a portion adjacent to the second side of the display area 10.

Illustratively, at the first side of the display area 10, at least a portion of the first signal line 21 is located between the display area 10 and the second signal line 22. Illustratively, at the second side of the display area 10, at least a portion of the first signal line 21 is located between the display area 10 and the second signal line 22.

Illustratively, at the first side of the display area 10, there is a first spacing region 30 between the orthographic projection of the first signal line 21 onto the base 90 of the display substrate and the orthographic projection of the second signal line 22 onto the base 90. Illustratively, at the second side of the display area 10, there is a first spacing region 30 between the orthographic projection of the first signal line 21 onto the base 90 of the display substrate and the orthographic projection of the second signal line 22 onto the base 90.

Illustratively, the display substrate further includes the first planarization layer, the first planarization layer includes the first planarization portion 40 located at the periphery area 20, and the first planarization portion 40 near the first side of the display area 10. The first planarization portion 40 extends from a position near the display area 10 to a position that is remote from the display area 10.

Illustratively, the first planarization layer further includes a second planarization portion, and at least a portion of the second planarization portion is located within the display area 10.

Illustratively, the display substrate includes an active layer, a first gate insulation layer, a first gate metal layer, a second gate insulation layer, a second gate metal layer, an interlayer insulating layer, a first source-drain metal layer, a first planarization layer, a second source-drain metal layer, a second planarization layer 50, an anode layer, a light-emitting function layer, a cathode layer, an encapsulation layer 80, which layers are stacked on one another in a direction away from the base 90 in the sequence listed. Illustratively, the display substrate further includes a first passivation layer, the first passivation layer is located between the first source-drain metal layer and the first planarization layer. Illustratively, the display substrate further includes a second passivation layer, and the second passivation layer is located between the second source-drain metal layer and the second planarization layer 50.

Illustratively, the second planarization layer 50 includes the first via hole 51, and the first via hole 51 is for discharging water vapor in the display substrate preparing process.

Illustratively, the orthographic projection of the first via hole 51 onto the base 90 extends in the first direction.

Illustratively, at least a portion of the orthographic projection of the first via hole 51 onto the base 90 is located within the first spacing region 30.

Illustratively, the orthographic projection of the first via hole 51 onto the base 90 overlaps with the first spacing region 30 at a first overlap region; the orthographic projection of the first planarization portion 40 onto the base 90 overlaps with the first overlap region at a second overlap region; the first overlap region and the second overlap region both extend in the first direction.

According to the above-mentioned specific structure of the display substrate, in the display substrate provided by embodiments of the present disclosure, the first spacing region 30 is provided between the orthographic projection of the first signal line 21 onto the base 90 of the display substrate and the orthographic projection of the second signal line 22 onto the base 90; the second planarization layer 50 includes the first via hole 51, and the orthographic projection of the first via hole 51 onto the base 90 has the first overlap region overlapping with the first spacing region 30; the orthographic projection of the first planarization portion 40 onto the base 90 has the second overlap region overlapping with the first overlap region. By arranging the display substrate in such a structure, the first planarization layer can fill in the second overlap region, such that the segment difference at the second overlap region can be reduced, thereby advantageously reducing the risk that other functional film layers which are subsequently formed break when crossing the second overlap region, effectively preventing the ambient water vapor and oxygen from intruding into the display substrate through the second overlap region, and thus improving the service life of the display substrate and the yield of the display substrate.

In some embodiments, the first overlap region is arranged to be located inside the orthographic projection of the first planarization portion 40 onto the base 90.

The above-mentioned arrangement further reduces the risk that other functional film layers which are subsequently formed break when crossing the second overlap region, effectively preventing the ambient water vapor and oxygen from intruding into the display substrate through the first overlap region, and thus improving the service life of the display substrate.

Figure 10:
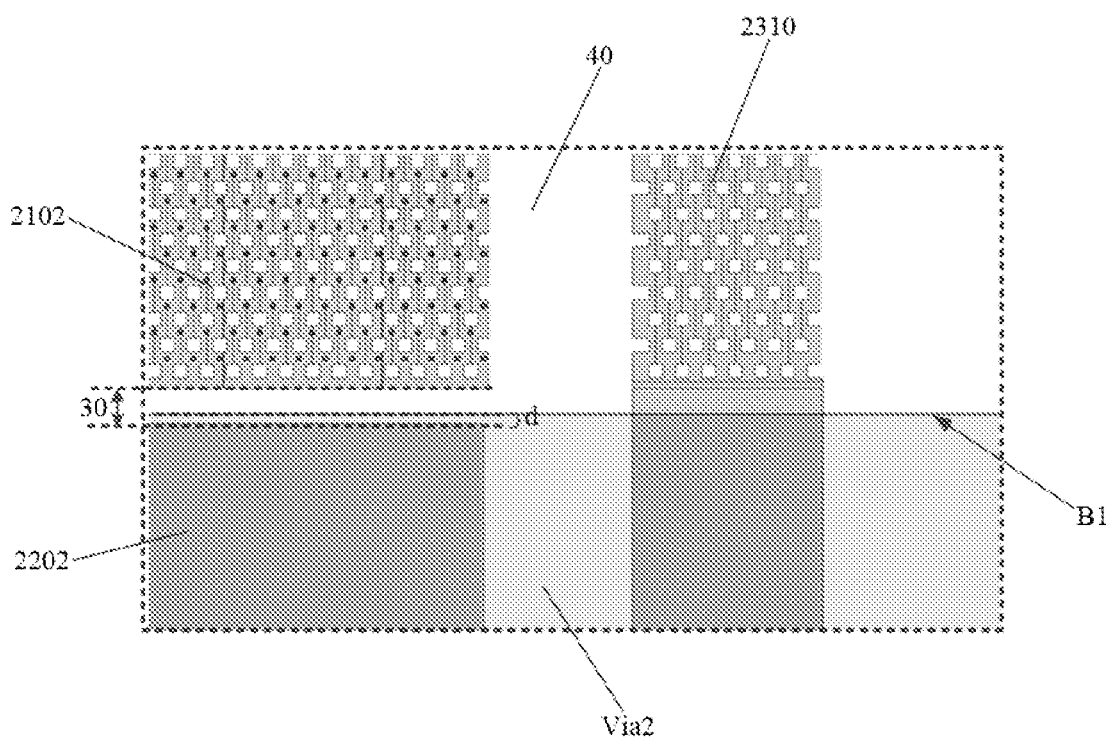
FIG. 10 is a second enlarged schematic view of a part of film layers included in the portion X2 in FIG. 1.

As shown in FIG. 10, in some embodiments, the orthographic projection of the first planarization portion 40 onto the base 90 at least partially overlaps with the orthographic projection of the first signal line 21 onto the base 90.

There is a second spacing region (e.g. a region with a width d in FIG. 10) between the orthographic projection of the first planarization portion 40 onto the base 90 and the orthographic projection of the second signal line 22 onto the base 90.

Figure 16:
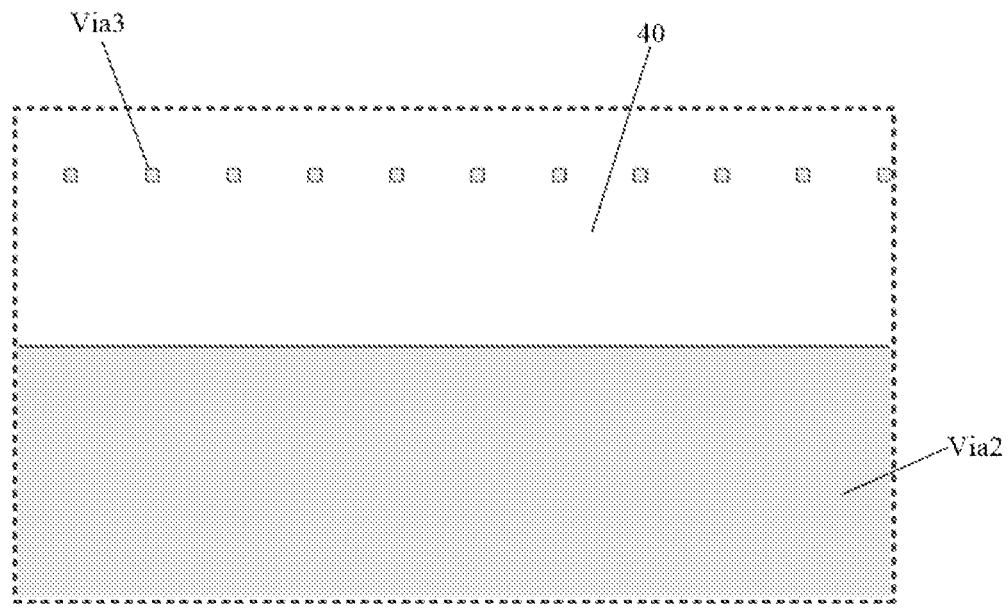
FIG. 16 is a schematic view of a layout for a first planarization portion in FIG. 6.
Figure 20:
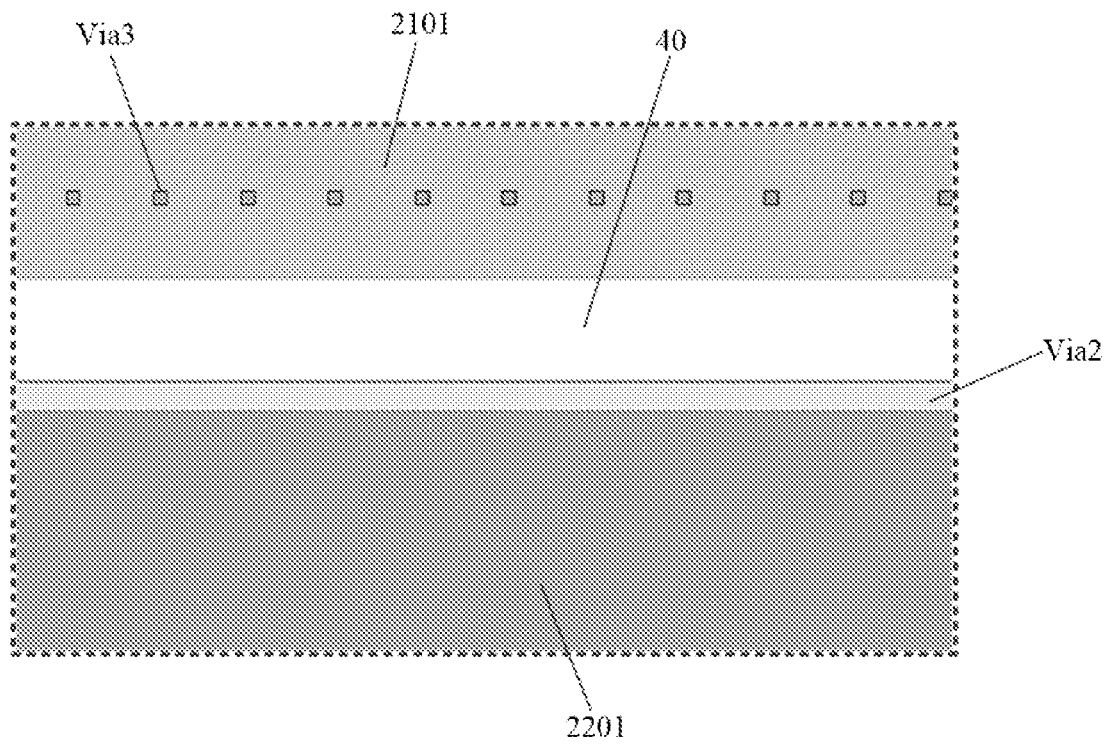
FIG. 20 is a schematic view of a layout for a first source-drain metal layer and a first planarization portion in FIG. 6.
Figure 21:
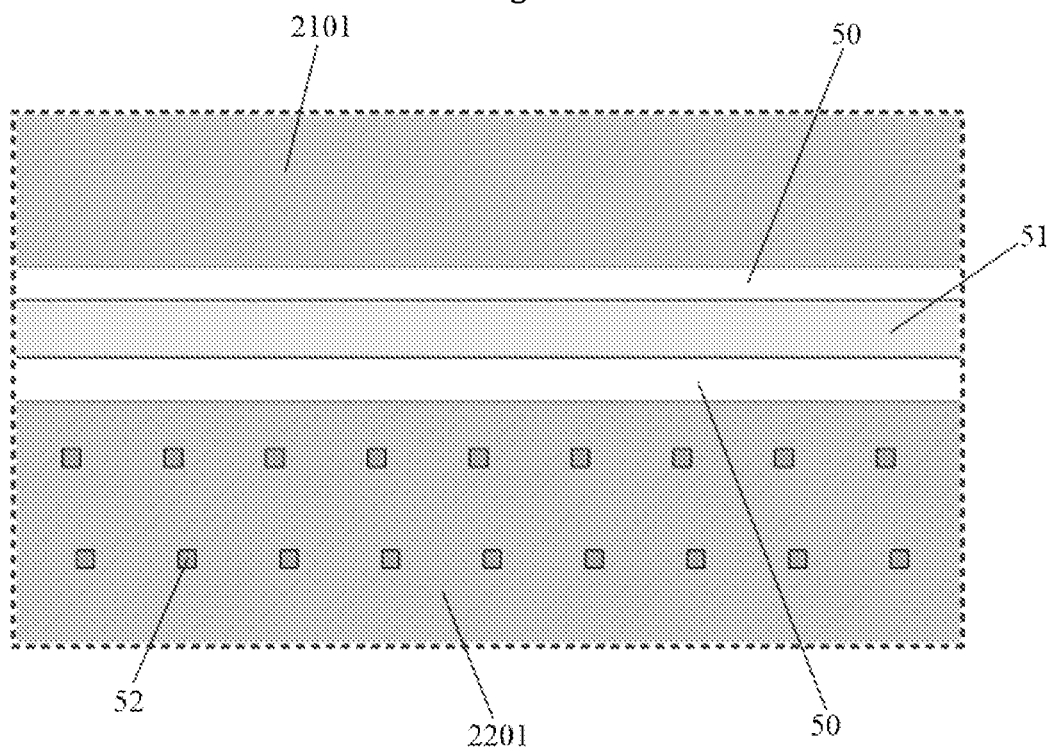
FIG. 21 is a schematic view of a layout for a first source-drain metal layer and a second planarization layer of FIG. 6.
Figure 22:
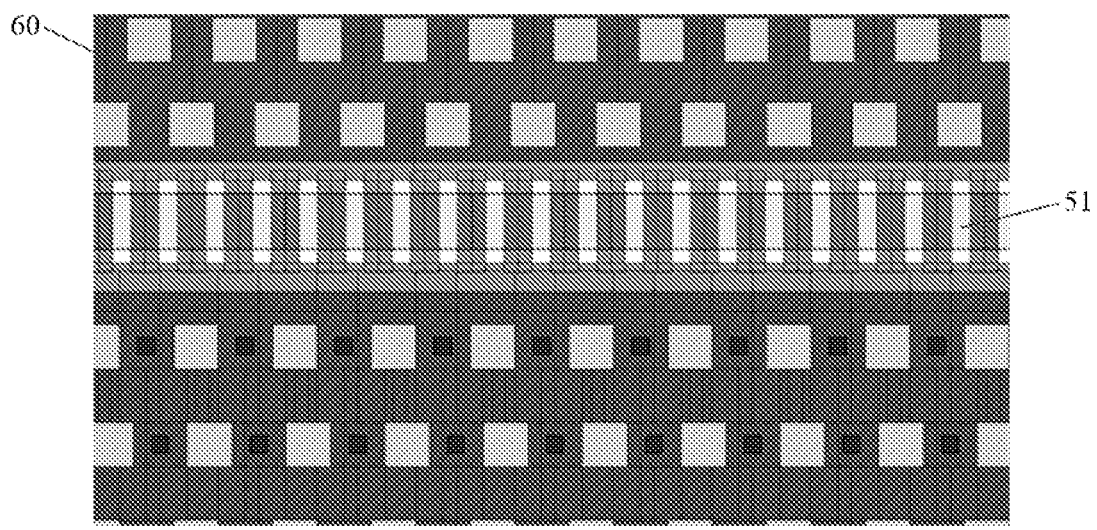
FIG. 22 is a schematic view of a layout for an electrically conductive connecting layer added to FIG. 20.

As shown in FIGS. 16, 20 and 22, illustratively, a plurality of third via holes Via3 is arranged on the first planarization portion 40, in a case that the first signal line 21 includes a first transmission pattern 2101 located between the first planarization portion 40 and the base 90, and includes a second transmission pattern 2102 is located at a side of the first planarization portion 40 facing away from the base 90, the orthographic projection of the first transmission pattern 2101 onto the base 90 at least partially overlaps with the orthographic projection of the first planarization portion 40 onto the base 90, the orthographic projection of the second transmission pattern 2102 onto the base 90 at least partially overlaps with the orthographic projection of the first planarization portion 40 onto the base 90, the first transmission pattern 2101 and the second transmission pattern 2102 may be coupled through the plurality of third via holes Via3. Illustratively, the plurality of third via holes Via3 is arranged in an array.

Illustratively, the orthographic projection of the first planarization portion 40 onto the base 90 does not overlap with the orthographic projection of the second signal line 22 onto the base 90.

In the above-mentioned arrangement, the second spacing region is provided between the orthographic projection of the first planarization portion 40 onto the base 90 and the orthographic projection of the second signal line 22 onto the base 90, so that an orthographic projection of a border of the first planarization portion 40 onto the base 90 and the orthographic projection of the second signal line 22 onto the base 90 do not overlap. In such manner, the first signal line 21 does not need to climb the segment difference formed by the first planarization portion 40.

Figure 9:
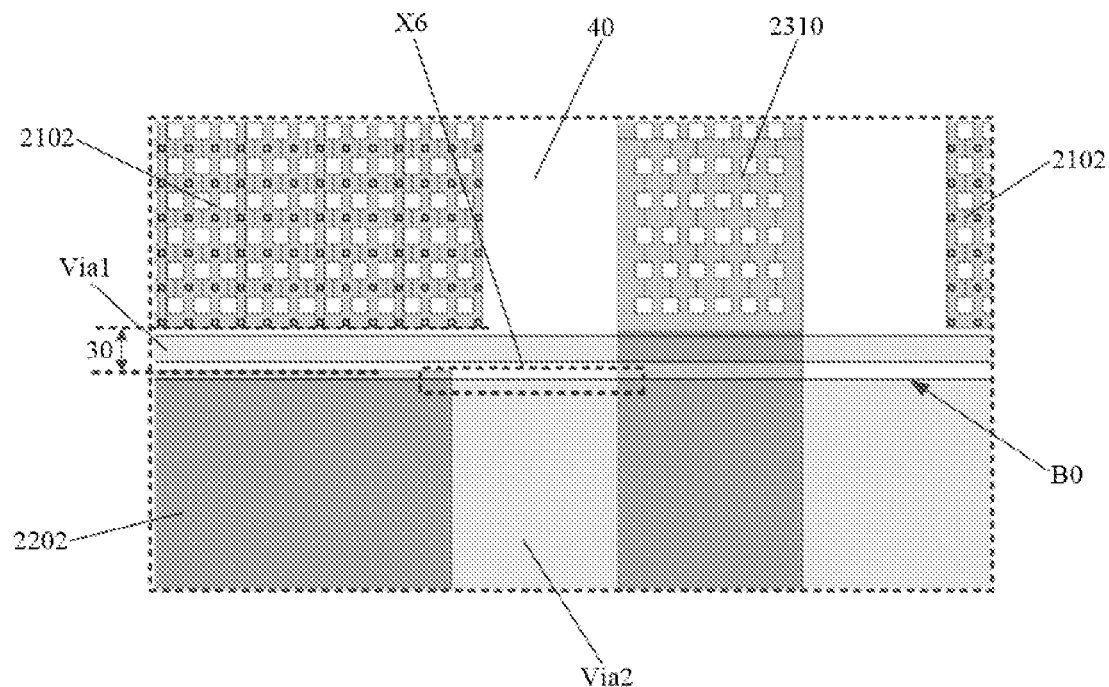
FIG. 9 is a first enlarged schematic view of a part of film layers included in the portion X2 in FIG. 1.

As shown in FIG. 9, in more detail, in a case that the second signal line 22 includes a third transmission pattern 2201 and a fourth transmission pattern 2202, the third transmission pattern 2201 is located between the first planarization layer and the base 90, and the fourth transmission pattern 2202 is located at a side of the first planarization layer facing away from the base 90. If the orthographic projection of the border B0 of the first planarization portion 40 onto the base 90 and the orthographic projection of the fourth transmission pattern 2202 on the base 90 are arranged to be overlapped, the fourth transmission pattern 2202 needs to cross a segment difference generated at the border of the first planarization portion 40. In this case, when the fourth transmission pattern 2202 and other conductive pattern(s) (such as a seventh transmission pattern 2310, which is also cross the segment difference, and transmits a different signal from that for the fourth transmission pattern 2202) are simultaneously formed in the same patterning process, the conductive material for manufacturing the fourth transmission pattern 2202 and other conductive pattern(s) may be left easily at the border (such as X6 portion) of the first planarization portion 40. As a result, a short circuit between the fourth transmission pattern 2202 and the other conductive pattern(s) may easily occur.

It should be noted that via holes Via 1 and Via 2 formed on the first planarization layer are illustrated in FIG. 9.

In the display substrate provided by the above-mentioned embodiments, the first signal line 21 does not need to climb the segment difference formed by the first planarization portion 40, so that a short circuit between the first signal line 21 and the other conductive pattern(s) can be advantageously prevented.

As shown in FIG. 10, in some embodiments, the width d of the second spacing region in a direction perpendicular to the first direction is set to satisfy: 8 µm≤d≤12 µm.

In the above arrangement, the risk that other functional film layers breaks at a location crossing the second overlap region, while preventing the possible short-circuit between the first signal line 21 and the other conductive pattern.

As shown in FIG. 5, FIG. 6, FIG. 12, FIG. 19, FIG. 21 and FIG. 22, in some embodiments, the display substrate further includes:
- a cathode layer, at least a portion of the cathode layer is located in the display area 10; and
- an electrically conductive connecting layer 60, the electrically conductive connecting layer 60 extends from the display area 10 to the periphery area 20, the electrically conductive connecting layer 60 is coupled to both the cathode layer and the second signal line 22; an orthographic projection of the electrically conductive connecting layer 60 onto the base 90 at least partially overlaps with the second overlap region.

Illustratively, the cathode layer may extend from the display area 10 to the periphery area 20.

Illustratively, the electrically conductive connecting layer 60 is located at a side of the second planarization layer 50 facing away from the base 90.

Illustratively, the orthographic projection of the electrically conductive connecting layer 60 onto the base 90 at least partially overlaps with the orthographic projection of the cathode layer onto the base 90, and the orthographic projection of the electrically conductive connecting layer 60 onto the base 90 at least partially overlaps with the orthographic projection of the second signal line 22 onto the base 90.

Illustratively, the electrically conductive connecting layer 60 includes a first conductive connecting pattern 601, a second conductive connecting pattern 602, and a plurality of third conductive connecting patterns 603. The plurality of third conductive connecting patterns 603 is arranged along the first direction, and each third conductive connecting pattern 603 is coupled to both the first conductive connecting pattern 601 and the second conductive connecting pattern 602. Illustratively, the first conductive connecting pattern 601, the second conductive connecting pattern 602, and the plurality of third conductive connecting patterns 603 are formed as an integral structure.

Illustratively, the orthographic projection of the first conductive connecting pattern 601 onto the base 90 at least partially overlaps with the orthographic projection of the cathode layer onto the base 90 at an overlapping area, and the first conductive connecting pattern 601 is coupled to the cathode layer at the overlapping area. The orthographic projection of the second conductive connecting pattern 602 onto the base 90 at least partially overlaps with the orthographic projection of the second signal line 22 onto the base 90 at a second overlapping area, and the second conductive connecting pattern 602 is coupled to the second signal line 22 at the second overlapping area. The orthographic projection of the third conductive connecting pattern 603 onto the base 90 at least partially overlaps with the second overlap region.

In the display substrate provided by the above-mentioned embodiments, since the segment difference of the second overlap region is significantly reduced, the electrically conductive connecting layer 60 is not easily broken when crossing the second overlap region. In this way, the ambient water vapor and oxygen is effectively prevented from intruding into the display substrate at the second overlap region, thereby improving the service life of the display substrate.

Figure 6:
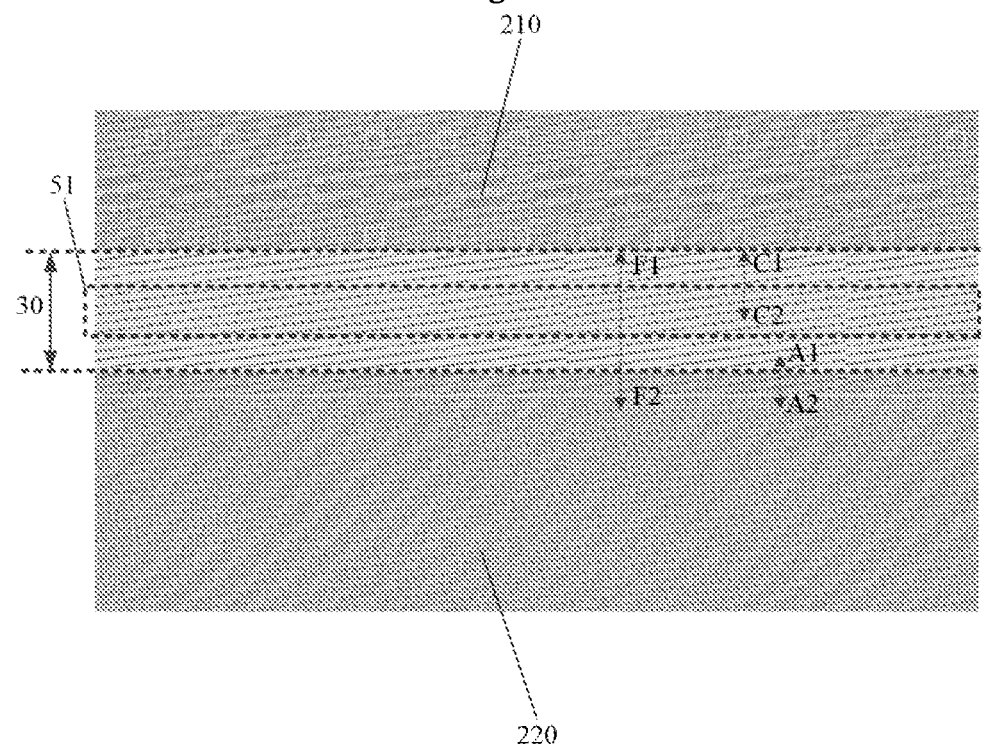
FIG. 6 is an enlarged schematic view of a portion X5 in FIG. 3.
Figure 18:
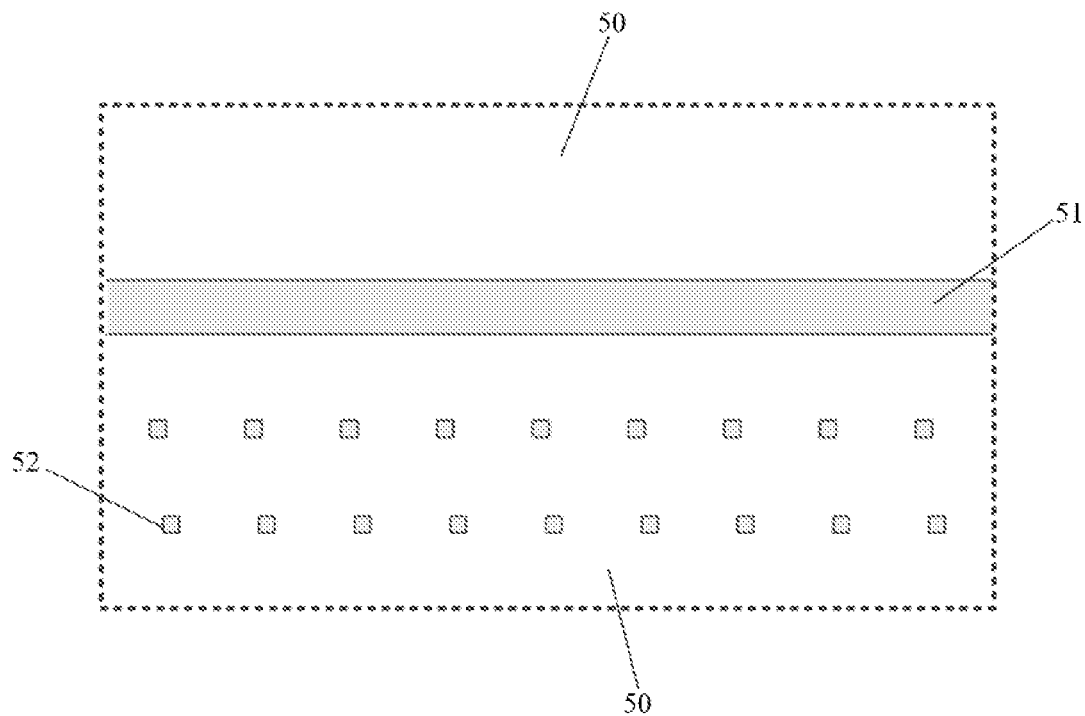
FIG. 18 is a schematic view of a layout for a second planarization layer in FIG. 6.
Figure 19:
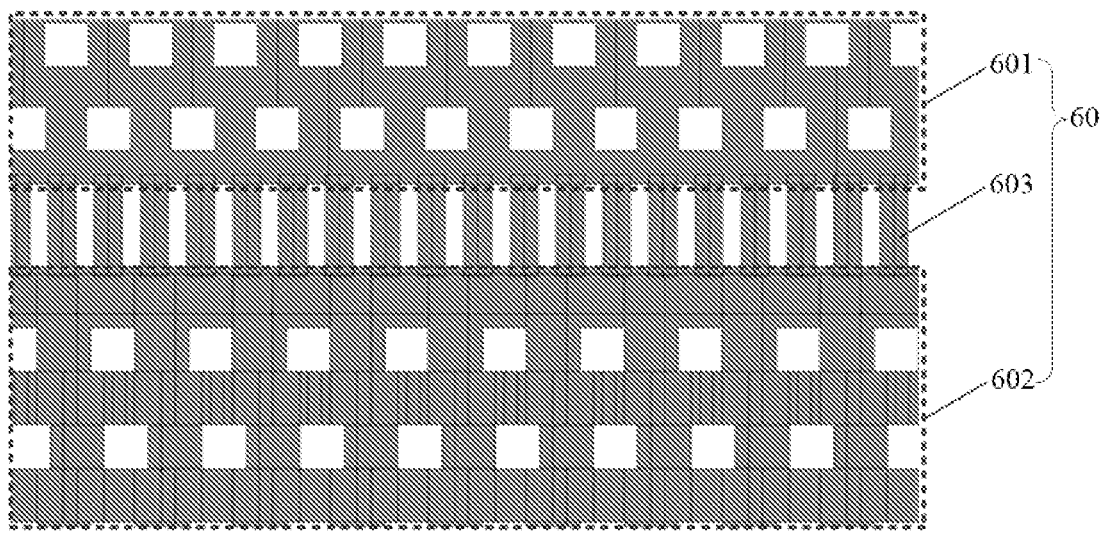
FIG. 19 is a schematic view of a layout for an electrically conductive connecting layer added to FIG. 6.

As shown in FIGS. 6 and 18, in some embodiments, the second planarization layer 50 also includes a plurality of second via holes 52 arranged in an array, and the electrically conductive connecting layer 60 is coupled to the second signal line 22 through a plurality of second via holes 52.

Illustratively, the orthographic projection of the plurality of second via holes 52 onto the base 90 is within the orthographic projection of the second signal line 22 onto the base 90.

In some embodiments, the display substrate is arranged to further include an anode layer, the electrically conductive connecting layer 60 and the anode layer are arranged in the same layer and formed by the same material, and the anode layer is also labeled with the numeral 60.

As the electrically conductive connecting layer 60 and the anode layer are arranged in the same layer and formed by the same material, the electrically conductive connecting layer 60 and the anode layer can be simultaneously formed in the same patterning process, thereby effectively simplifying the process of manufacturing the display substrate and reducing the manufacturing cost of the display substrate.

In some embodiments, the display substrate further includes an encapsulation layer 80, at least a portion of the encapsulation layer 80 is located at a side of the cathode layer facing away from the base 90, the encapsulation layer 80 covering the second overlap region.

In the display substrate provided by the above-mentioned embodiments, since the segment difference of the second overlap region is effectively reduced, the encapsulation layer 80 is not easily broken when crossing the second overlap region. In this manner, the ambient water vapor and oxygen can be effectively prevented from intruding into the display substrate through the second overlap region, thereby improving the service life of the display substrate.

Figure 1:
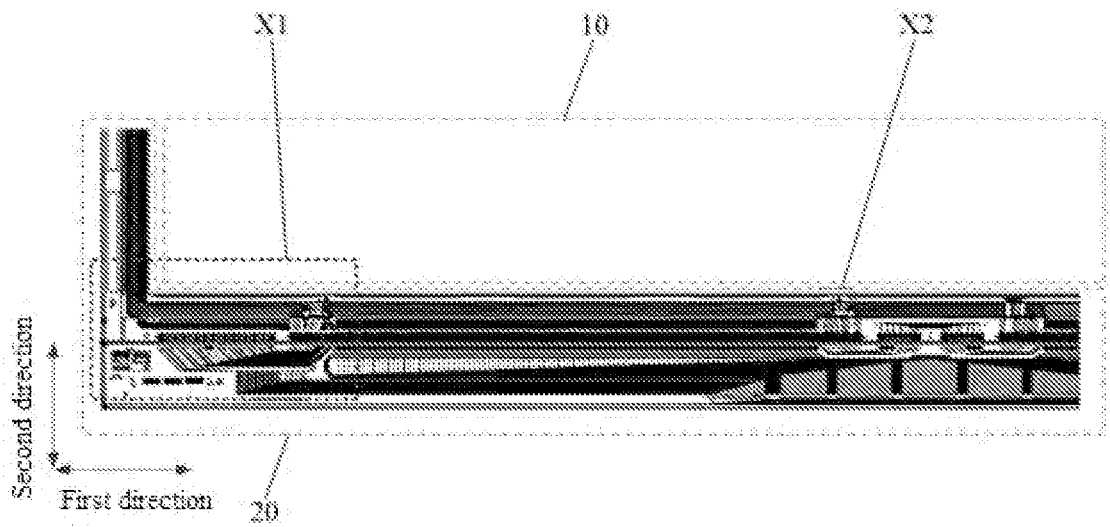
FIG. 1 is a schematic view of a partial structure at a lower frame of a display substrate provided by embodiments of the present disclosure.
Figure 2:
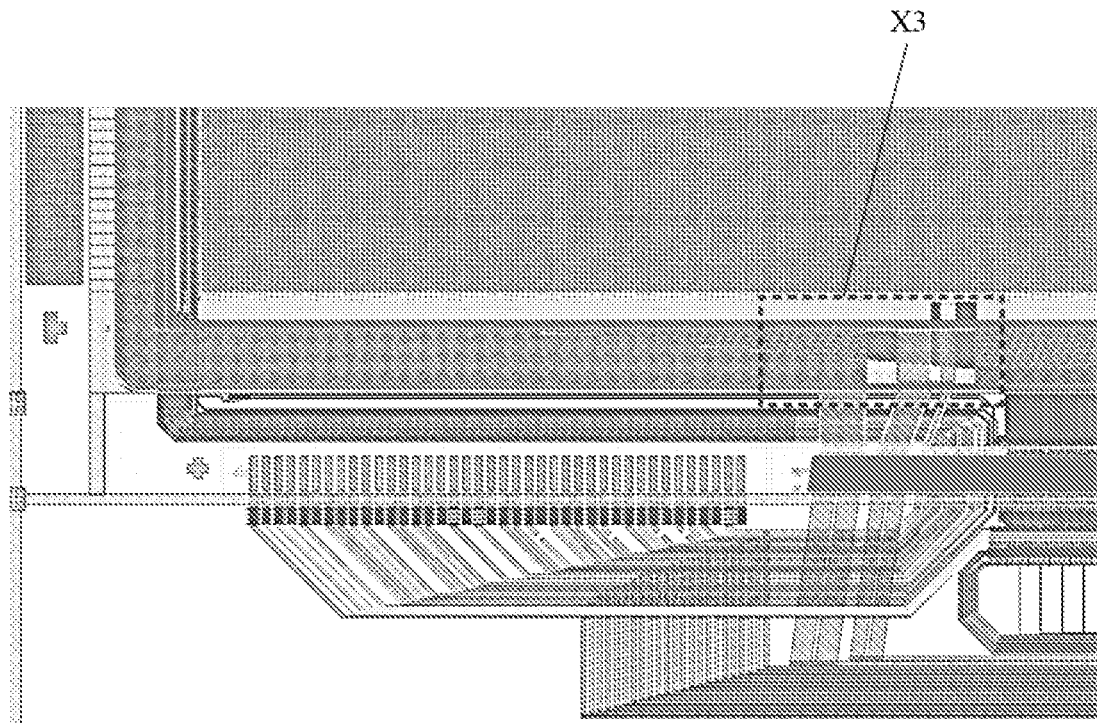
FIG. 2 is an enlarged schematic view of a portion X1 in FIG. 1.
Figure 3:
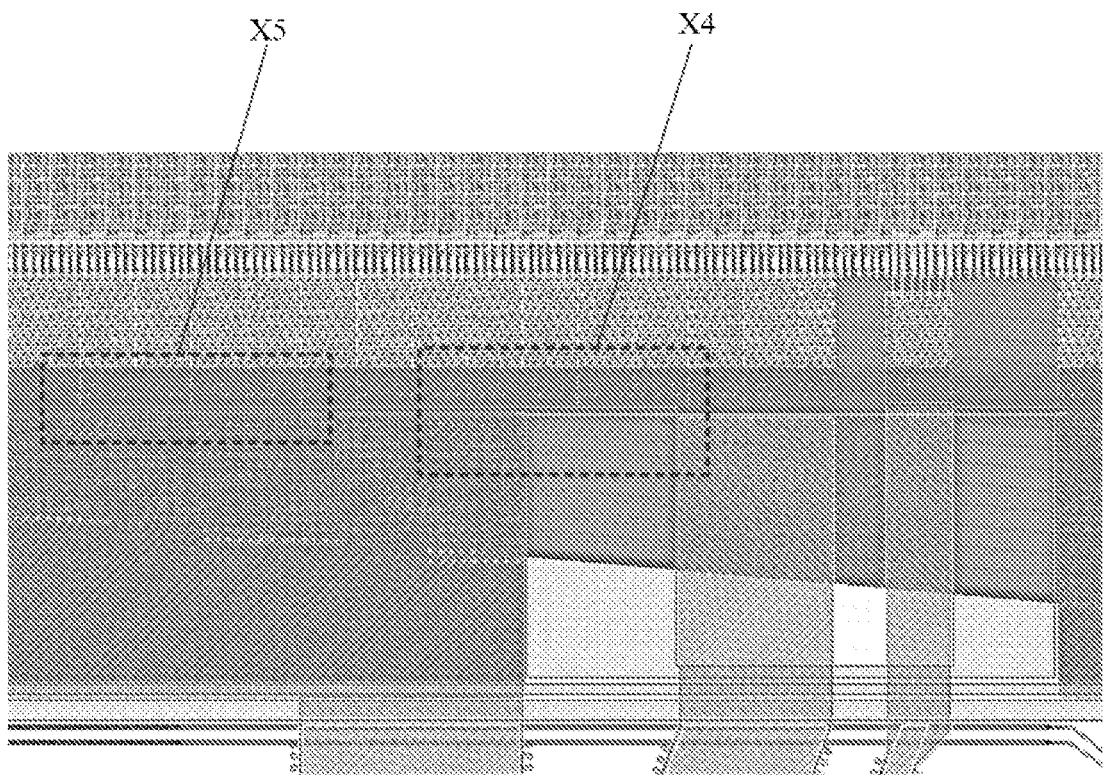
FIG. 3 is a first enlarged schematic view of a portion X3 in FIG. 2.
Figure 4:
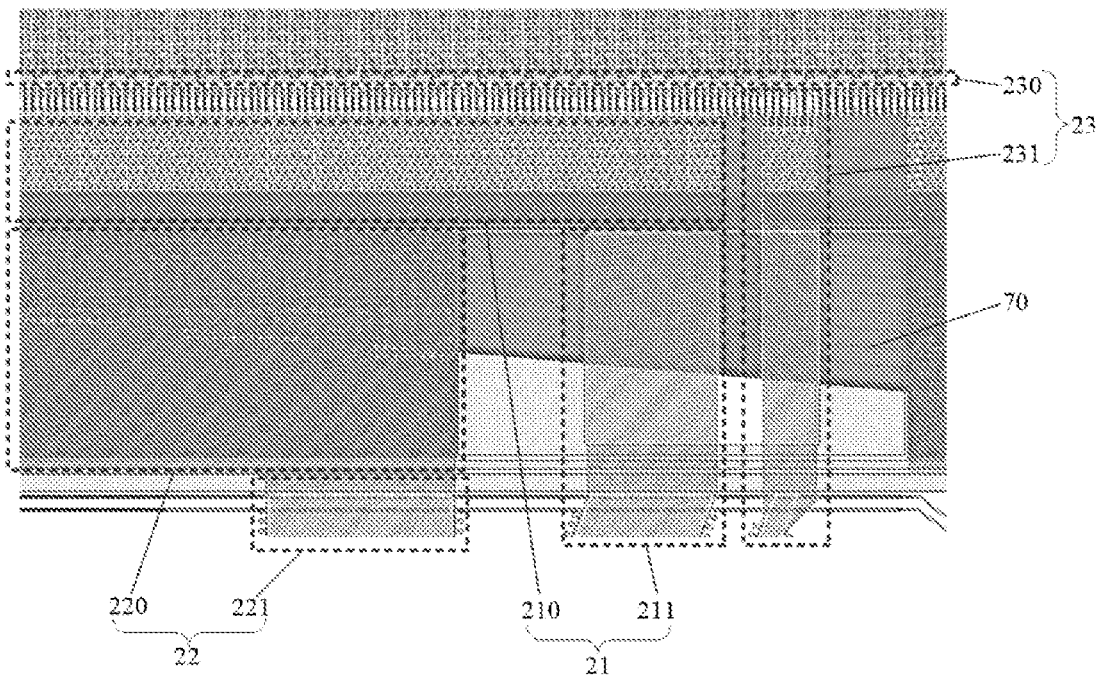
FIG. 4 is a second enlarged schematic view of a portion X3 in FIG. 2.
Figure 5:
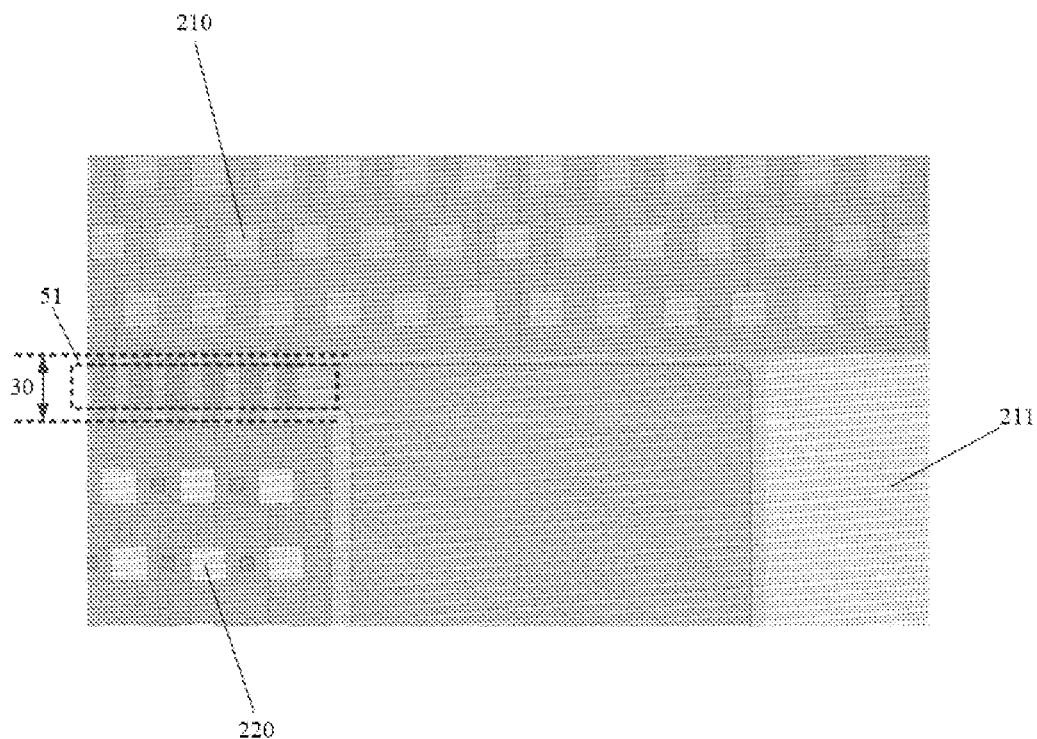
FIG. 5 is an enlarged schematic view of a portion X4 in FIG. 3.

As shown in FIG. 4, in some embodiments, the display substrate further includes:
- a plurality of fan-out lines 70, the plurality of fan-out lines 70 located at the periphery area 20, and an orthographic projection of at least part of the fan-out lines 70 onto the base 90 overlaps with the second overlap region.

Illustratively, the display substrate further includes a plurality of data lines, and the fan-out line 70 coupled to a corresponding data line and driving chip.

Figure 13:
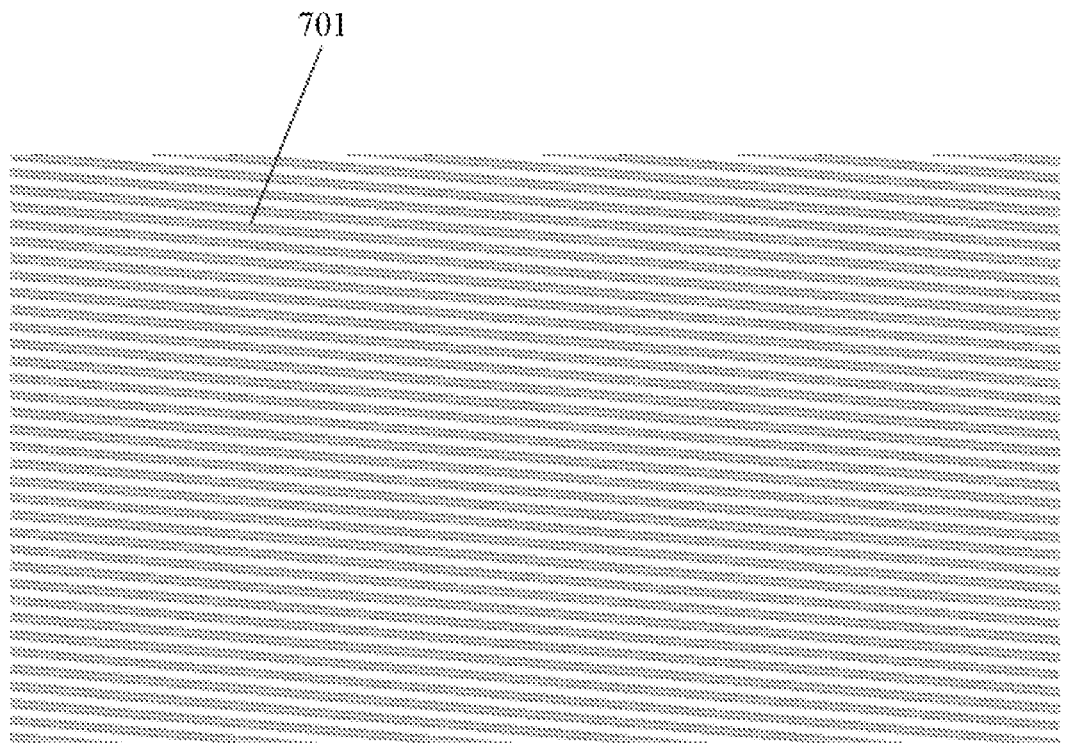
FIG. 13 is a schematic view of a layout for first fan-out lines in FIG. 6.
Figure 14:
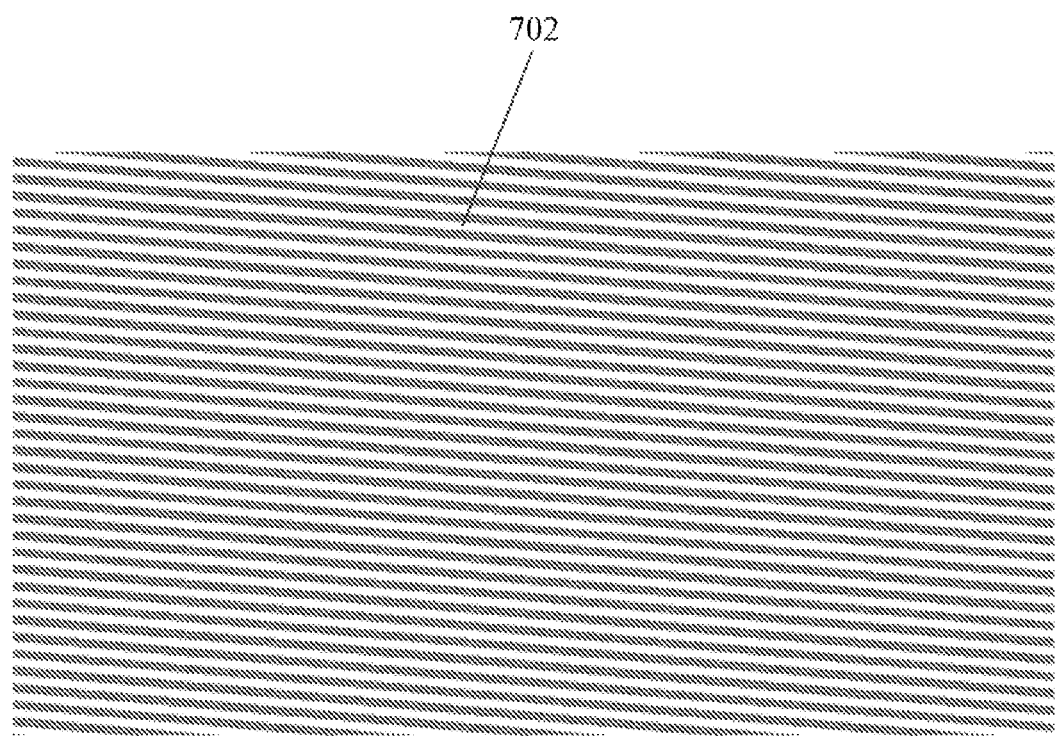
FIG. 14 is a schematic view of a layout for second fan-out lines in FIG. 6.

As shown in FIGS. 13 and 14, illustratively, the plurality of fan-out lines 70 include a plurality of first fan-out lines 701 and a plurality of second fan-out lines 702. The first fan-out lines 701 are formed by the first gate metal layer, and the plurality of second fan-out lines 702 is formed by the second gate metal layer.

In the above-mentioned arrangement, the orthographic projection of at least part of the fan-out lines 70 onto the base 90 overlaps with the second overlap region, so that the first planarization portion 40 located at the second overlap region can planarize the un-planarization caused by the fan-out lines 70, and thus preventing the un-planarization caused by the fan-out lines 70 from introducing cracks in film layer located thereabove.

As shown in FIGS. 3 to 6, in some embodiments, the first signal line 21 includes a first transmission portion 210 and a second transmission portion 211 coupled with each other, the first transmission portion 210 extends in the first direction, at least a portion of the second transmission portion 211 extends in a second direction, the second direction intersecting with the first direction.

The second signal line 22 includes a third transmission portion 220 and a fourth transmission portion 221 coupled with each other, the third transmission portion 220 extends in the first direction, at least a portion of the fourth transmission portion 221 extends in the second direction, the fourth transmission portion 221 and the second transmission portion 211 are arranged along the first direction, there is the first spacing region 30 between an orthographic projection of the first transmission portion 210 onto the base 90 and an orthographic projection of the third transmission portion 220 onto the base 90.

Illustratively, the first direction includes a horizontal direction and the second direction includes a vertical direction.

Illustratively, the first signal line 21 includes the first transmission portion 210 and the second transmission portion 211, and the second transmission portion 211 is coupled to both the first transmission portion 210 and the driving chip.

Illustratively, the second signal line 22 includes the third transmission portion 220 and the fourth transmission portion 221, and the fourth transmission portion 221 is coupled to both the third transmission portion 220 and the driving chip.

Illustratively, the orthographic projection of the first transmission portion 210 onto the base 90 is located between the orthographic projection of the third transmission portion 220 onto the base 90 and the display area 10, and there is the first spacing region 30 between the orthographic projection of the first transmission portion 210 onto the base 90 and the orthographic projection of the third transmission portion 220 onto the base 90.

Illustratively, the orthographic projection of the fourth transmission portion 221 onto the base 90 and the orthographic projection of the second transmission portion 211 onto the base 90 are arranged at an interval along the first direction.

Figure 15:
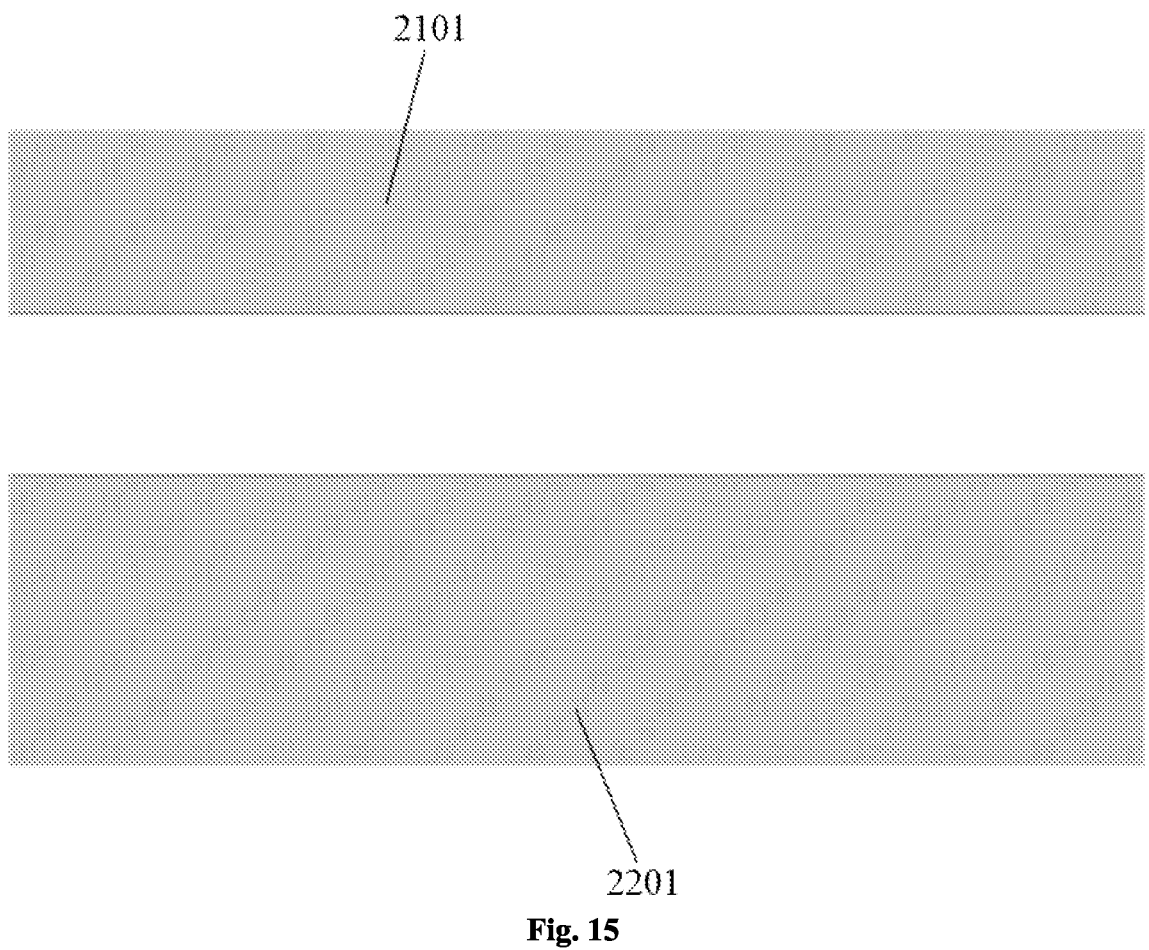
FIG. 15 is a schematic view of a layout for a first source-drain metal layer in FIG. 6.
Figure 17:
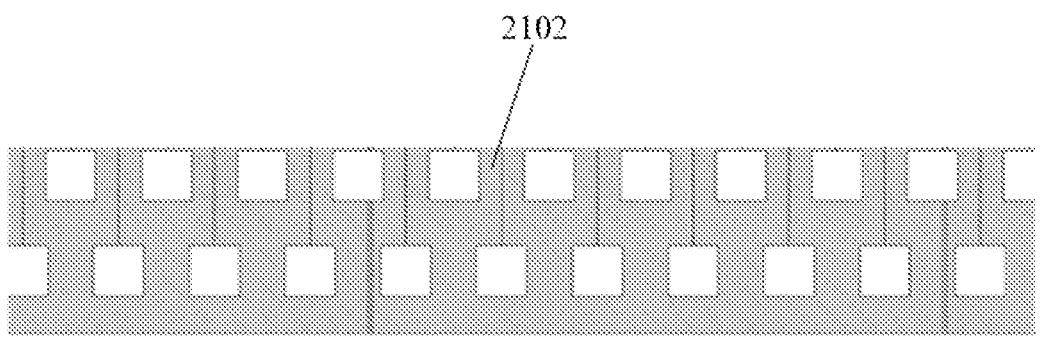
FIG. 17 is a schematic view of a layout for a second source-drain metal layer in FIG. 6.
Figure 17:
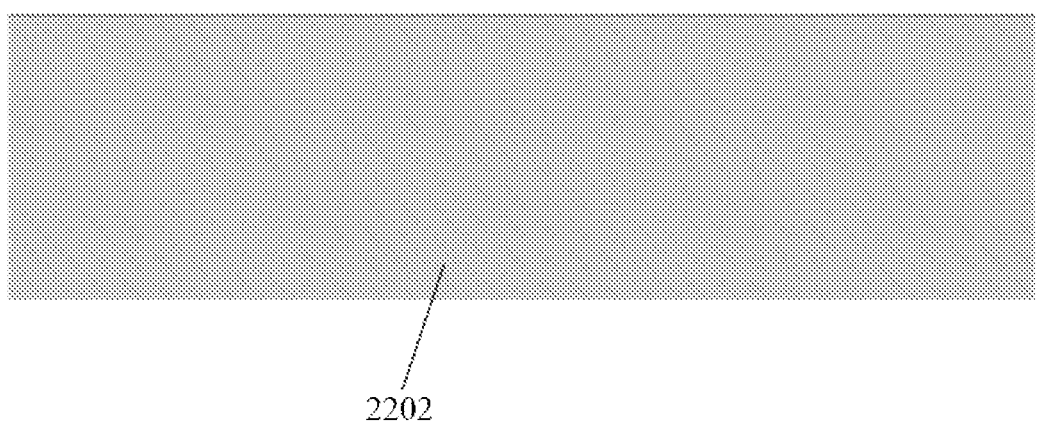

As shown in FIGS. 6, 15 and 17, in some embodiments, the first transmission portion 210 includes a first transmission pattern 2101 and a second transmission pattern 2102 coupled with each other, and the first transmission pattern 2101 is located between the base 90 and the second transmission pattern 2102.

The third transmission portion 220 includes a third transmission pattern 2201 and a fourth transmission pattern 2202 coupled with each other, the third transmission pattern 2201 is located between the base 90 and the fourth transmission pattern 2202, and there is the first spacing region 30 between the orthographic projection of the second transmission pattern 2102 onto the base 90 and the orthographic projection of the fourth transmission pattern 2202 onto the base 90.

Illustratively, both the first transmission pattern 2101 and the second transmission pattern 2102 extend in the first direction. Both the third transmission pattern 2201 and the fourth transmission pattern 2202 extend in the first direction.

Illustratively, the first planarization portion 40 is provided between the first transmission pattern 2101 and the second transmission pattern 2102. No insulating layer is provided between the third transmission pattern 2201 and the fourth transmission pattern 2202, and the third transmission pattern 2201 and the fourth transmission pattern 2202 may be joined over their whole surfaces.

Illustratively, there is the first spacing region 30 between the orthographic projection of the second transmission pattern 2102 onto the base 90 and the orthographic projection of the fourth transmission pattern 2202 onto the base 90, there is the third spacing region between the orthographic projection of the first transmission pattern 2101 onto the base 90 and the orthographic projection of the third transmission pattern 2201 onto the base 90. The width of the third spacing region is greater than the width of the first spacing region 30 in a direction perpendicular to the first direction.

In some embodiments, the display substrate further includes a first source-drain metal layer and a second source-drain metal layer, the first source-drain metal layer is located between the base 90 and the second source-drain metal layer.

The first transmission pattern 2101 and the third transmission pattern 2201 are arranged in the same layer and formed by the same material as the first source-drain metal layer; the second transmission pattern 2102 and the fourth transmission pattern 2202 are arranged in the same layer and formed by the same material as the second source-drain metal layer.

In the above-mentioned arrangement, the first transmission pattern 2101 and the third transmission pattern 2201 can be formed in the same patterning process as the first source-drain metal layer, and the second transmission pattern 2102 and the fourth transmission pattern 2202 can be formed in the same patterning process as the second source-drain metal layer, which can effectively simplify the process of manufacturing the display substrate and reduce the manufacturing cost of the display substrate.

In some embodiments, the second transmission portion 211 is arranged to include a fifth transmission pattern and a sixth transmission pattern 2110 that are stacked one on another, where the fifth transmission pattern and the first transmission pattern 2101 are formed as an integral structure, and the sixth transmission pattern 2110 and the second transmission pattern 2102 are formed as an integral structure.

Illustratively, the fifth transmission pattern is coupled to the sixth transmission pattern 2110.

Illustratively, at least a portion of the fifth transmission pattern extends in the second direction and at least a portion of the sixth transmission pattern 2110 extends in the second direction.

The above arrangement is advantageous for improving the reliability of the first signal line 21.

Figure 11:
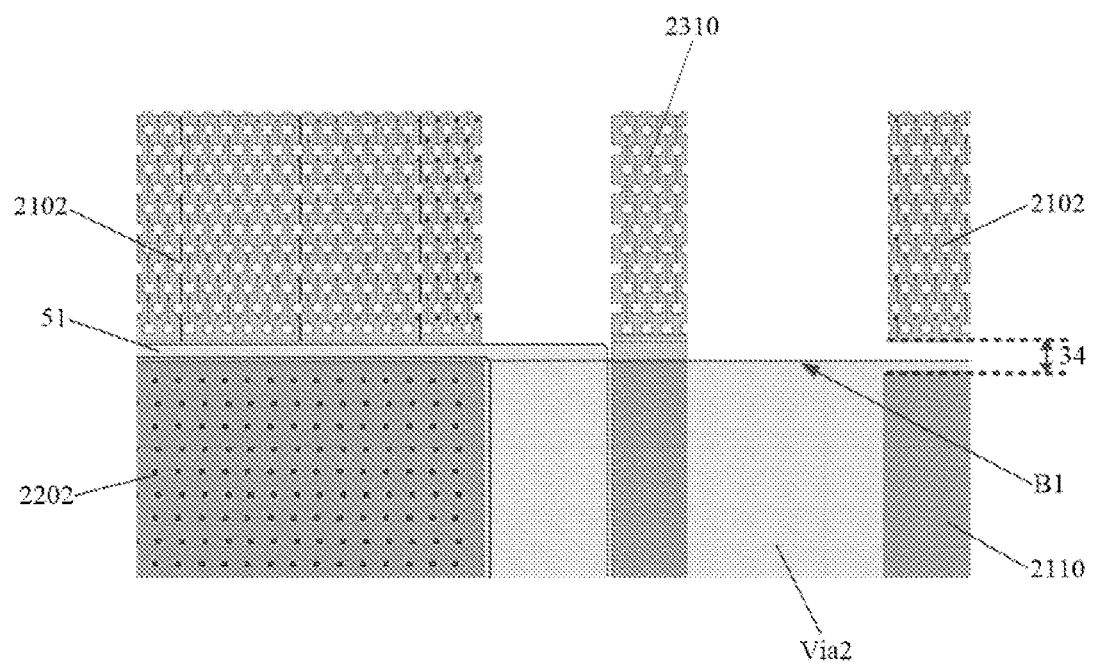
FIG. 11 is a third enlarged schematic view of portion of film layer included in portion X2 of FIG. 1.
Figure 12:
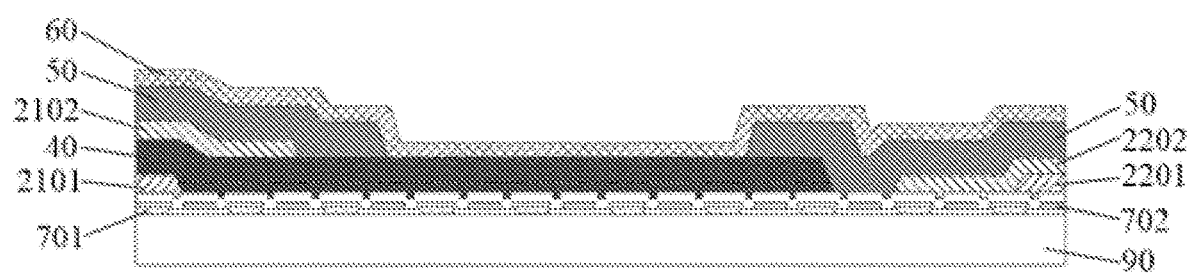
FIG. 12 is a cross-sectional schematic view of FIG. 6 taken along the direction F1F2.

As shown in FIGS. 11 and 15, in some embodiments, the second transmission portion 211 is arranged to include a fifth transmission pattern and a sixth transmission pattern 2110 that are stacked one on another, and the fifth transmission pattern and the first transmission pattern 2101 are formed as an integral structure; there is a fourth spacing region 34 between the sixth transmission pattern 2110 and the second transmission pattern 2102, an orthographic projection of the fourth spacing region 34 onto the base 90 at least partially overlaps with an orthographic projection of a first border B1 of the first planarization portion 40 facing towards the third transmission portion 220 onto the base 90.

Illustratively, the sixth transmission pattern 2110 and the second transmission pattern 2102 may be electrically connected through the fifth transmission pattern and the first transmission pattern 2101.

With the above-mentioned arrangement, not only the reliability of the first signal line 21 can be advantageously improved, but also the sixth transmission pattern 2110 and the second transmission pattern 2102 can be prevented from crossing the first border B1, thereby avoiding an issue of possible short-circuit burning between the second signal line 22 and the third signal line 23 caused by the manufacturing material left on the first border B1.

In some embodiments, the fourth transmission portion 221 includes a ninth transmission pattern and a tenth transmission pattern that are stacked one on another, the ninth transmission pattern is located between the tenth transmission pattern and the base 90.

Illustratively, the ninth transmission pattern and the third transmission pattern 2201 are formed as an integral structure. The tenth transmission pattern and the fourth transmission pattern 2202 are formed as an integral structure.

The above arrangement is advantageous for improving the reliability of the second signal line 22.

As shown in FIGS. 4, 10, and 11, in some embodiments, the display substrate further includes:
a third signal line 23, the third signal line 23 is located at the periphery area 20; the third signal line 23 includes a fifth transmission portion 230 and a sixth transmission portion 231 coupled with each other, where the fifth transmission portion 230 extends in the first direction, and at least a portion of the sixth transmission portion 231 extends in the second direction; the sixth transmission portion 231 and the second transmission portion 211 are arranged along the first direction; and
the orthographic projection of the first border B1 of the first planarization portion 40 facing towards the third transmission portion 220 onto the base 90 overlaps with both the orthographic projection of the second transmission portion 211 onto the base 90, and the orthographic projection of the sixth transmission portion 231 onto the base 90.

Illustratively, the third signal line 23 includes two fifth transmission portions 230 and a plurality of sixth transmission portions 231, one of the two fifth transmission portions 230 is located at a position adjacent to the first side of the display area 10, and the other of the two fifth transmission portions 230 is located at a position adjacent to the second side of the display area 10. The plurality of sixth transmission portions 231 are coupled with the fifth transmission portion 230 adjacent to the first side. The sixth transmission portion 231 is also coupled to the driving chip.

Illustratively, the display substrate further includes an initialization signal layer, at least a portion of the initialization signal layer is located at the display area 10, and the initialization signal layer is coupled to the two fifth transmission portions 230.

Illustratively, at the same side adjacent to the display area 10, the fifth transmission portion 230, the first transmission portion 210, and the third transmission portion 220 are sequentially arranged at an interval along a direction away from the display area 10.

Illustratively, the sixth transmission portion 231, the second transmission portion 211 and the fourth transmission portion 221 arranged at an interval along the first direction.

Illustratively, the orthographic projection of the first border B1 of the first planarization portion 40 facing towards the third transmission portion 220 onto the base 90 does not overlap the following two items: the orthographic projection of the third transmission portion 220 onto the base 90, and the orthographic projection of the fourth transmission portion 221 onto the base 90.

In the display substrate provided by the above-mentioned embodiments, by arranging the orthographic projection of the first border B1 of the first planarization portion 40 facing towards the third transmission portion 220 onto the base 90 to be not overlapped with the orthographic projection of the third transmission portion 220 onto the base 90 and the orthographic projection of the fourth transmission portion 221 onto the base 90; and by arranging the orthographic projection of the first border B1 of the first planarization portion 40 facing towards the third transmission portion 220 onto the base 90 to be overlapped with both the orthographic projection of the second transmission portion 211 onto the base 90 and the orthographic projection of the sixth transmission portion 231 onto the base 90, a short circuit occurring in the following sections can be avoided: sections of the second transmission portion 211 arranged at the same layer as the second signal line 22 and climbing the segment difference generated by the first border B1; and sections of the six transmission portion 211 arranged at the same layer as the second signal line 22 and climbing the segment difference generated by the first border B1.

In some embodiments, the sixth transmission portion 231 includes a seventh transmission pattern 2310, the seventh transmission pattern 2310 and the second transmission pattern 2102 are arranged in different layers.

By arranging the seventh transmission pattern 2310 and the second transmission pattern 2102 in different layers, the seventh transmission pattern 2310 and the second transmission pattern 2102 are not manufactured in the same patterning process, so that even if both the second transmission pattern 2102 and the seventh transmission pattern 2310 b climb the segment difference generated by the first border B1, a short circuit does not occur between the second transmission pattern 2102 and the seventh transmission pattern 2310. In this manner, an issue of burning caused by a short circuit between the different signal lines in the display substrate can be avoided.

In some embodiments, the sixth transmission portion 231 includes an eighth transmission pattern, the eighth transmission pattern is coupled to the seventh transmission pattern 2310. The eighth transmission pattern and the first transmission pattern 2101 are arranged in the same layer and formed by the same material.

Illustratively, the eighth transmission pattern is located between the seventh transmission pattern 2310 and the base 90, an orthographic projection of the eighth transmission pattern onto the base 90 at least partially overlaps with an orthographic projection of the seventh transmission pattern 2310 onto the base 90.

By arranging the eighth transmission pattern and the first transmission pattern 2101 in the same layer and forming the same by the same material, the eighth transmission pattern and the first transmission pattern 2101 can be formed in the same patterning process simultaneously, thereby effectively simplifying the process of manufacturing the display substrate and reducing the manufacturing cost of the display substrate.

In some embodiments, the first signal line 21 includes a positive power supply line, the second signal line 22 includes a negative power supply line, and the third signal line 23 includes an initialization signal line.

It should be noted that a single source-drain metal layer and a single anode layer may also be applied in the display substrate provided by the embodiments if the layout space and pixel dimensions meet the demands. Two source-drain metal layers and two anode layers can be used when the demands cannot be met.

Embodiments of the present disclosure also provides a display apparatus, including the display substrate provided by the embodiments described above.

In the display substrate provided by the above-mentioned embodiments, the first spacing region 30 is set between the orthographic projection of the first signal line 21 on the base 90 of the display substrate and the orthographic projection of the second signal line 22 onto the base 90; the second planarization layer 50 includes the first via hole 51, arranged between the orthographic projection of the first via hole 51 onto the base 90 and the first spacing region 30 is the first overlap region; arranged between the orthographic projection of the first planarization portion 40 onto the base 90 and the first overlap region is the second overlap region. By arranging the above-mentioned display substrate as such a structure, the second overlap region can be filled with the first planarization layer, which can reduce the segment difference of the second overlap region, and thereby advantageously reduce the risk for other functional film layer(s) formed subsequently to be broke at a location crossing the second overlap region. In this manner, the intrusion of the ambient water vapor and oxygen into the display substrate through the second overlap region can be prevented effectively, and thus the service life of the display substrate and the yield of the display substrate can be improved.

Therefore, the display apparatus provided by the embodiments of the present disclosure also has the above-mentioned advantageous effects when the including above-mentioned display substrate, and the description thereof will not be repeated here.

It should be noted that the display apparatus may be any product or component with a display function, such as a television, a displayer, a digital photo frame, a mobile phone and a tablet computer. The display apparatus may also include a flexible circuit board, a printed circuit board and a back plate.

Embodiments of the present disclosure also provides a method of manufacturing display substrate, which is used for manufacturing the display substrate provided by the above embodiments, the display substrate includes a display area 10 and a periphery area 20 surrounding the display area 10; the manufacturing method including:

i. manufacturing a first signal line 21, the first signal line 21 being located at the periphery area 20, the first signal line 21 including a portion extending in a first direction;

ii. manufacturing a second signal line 22, the second signal line 22 being located at the periphery area 20, the second signal line 22 including a portion extending in the first direction, where at least a portion of the first signal line 21 is located between the display area 10 and the second signal line 22, a first spacing region 30 is provided between an orthographic projection of the first signal line 21 onto a base 90 of the display substrate and an orthographic projection of the second signal line 22 onto the base 90;

iii. manufacturing a first planarization layer, the first planarization layer including a first planarization portion 40 located at the periphery area 20; and iv. manufacturing a second planarization layer 50, the second planarization layer 50 including a first via hole 51, the orthographic projection of the first via hole 51 onto the base 90 overlapping with the first spacing region 30 at a first overlap region; the orthographic projection of the first planarization portion 40 onto the base 90 overlapping with the first overlap region at a second overlap region.

In the display substrate manufactured by the method provided by embodiments of the present disclosure, the first spacing region 30 is provided between the orthographic projection of the first signal line 21 onto the base 90 of the display substrate and the orthographic projection of the second signal line 22 onto the base 90; the second planarization layer 50 includes the first via hole 51, and there is the first overlap region between the orthographic projection of the first via hole 51 onto the base 90 and the first spacing region 30; there is the second overlap region between the orthographic projection of the first planarization portion 40 onto the base 90 and the first overlap region. By manufacturing the display substrate as such a structure, the second overlap region can be filled with the first planarization layer, which can reduce the segment difference of the second overlap region, and thus advantageously reduce the risk for the subsequently formed other functional film layer(s) to be broke when crossing the second overlap region. In this manner, the intrusion of ambient water vapor and oxygen into the display substrate through the second overlap region can be effectively avoided, thereby improving the service life of the display substrate and the yield of the display substrate.

It should be noted that the "same layer" in the embodiments of the present disclosure may refer to the film layer on the same structural layer. In other words, for example, the film layer in the same layer may be a layer structure formed by forming a film layer for forming a specific pattern by using the same film-forming process, and then patterning the film layer in a single patterning process with the same mask. Depending on the particular pattern, a single patterning process may include multiple exposure, developing, or etching processes, and the formed particular patterns in the layer structure may or may not be continuous. These particular patterns may also be at different heights or have different thicknesses.

In method embodiments of the present disclosure, the sequence number of each step cannot be used to define the sequence of various steps. For a person of ordinary skill in the art, variations in the sequence of various steps is also within the protection scope of the present disclosure.

It should be noted that various embodiments in this specification is described in a progressive manner, the same and similar parts among various embodiments can be referred to each other, and each embodiment focuses on the differences from the other embodiments. In particular, with regard to the method embodiment, since it is substantially similar to the product embodiment, the description thereof is relatively simple, and reference can be made to a description of the product embodiment for the relevant part.

Unless defined otherwise, technical or scientific terms used in this disclosure shall have the ordinary meaning as understood by one of ordinary skill in the art to which this disclosure belongs. The use of "first", "second", and the like in this disclosure does not denote any order, quantity, or importance, but rather is used to distinguish one element from another. The word "comprise" or "include", and the like, means that the presence of an element or item preceding the word encompasses the presence of the element or item listed after the word and equivalents thereof, but does not exclude other elements or items. The terms "connect", "couple", or "link", and the like are not limited to physical or mechanical connections, but may include electrical connections, whether direct or indirect. The terms "upper", "lower", "left", "right", etc. are used only to indicate a relative position relationship, which may change accordingly when the absolute position of the described object changes.

It will be understood that when an element such as a layer, film, region, or substrate is referred to as being "on" or "under" another element, it can be "directly on" or "directly under" the other element or intervening elements may be present.

In the above description for the embodiments, particular features, structures, materials, or characteristics may be combined in any suitable manner in any one or more of the embodiment or examples.

The foregoing is only specific implementations of the present disclosure, but the protection scope of the present disclosure is not limited thereto, and any person skilled in the art who is familiar with the present technical field would have readily conceived of changes or substitutions within the technical range disclosed in the present disclosure, and all would be covered by the protection range of the present disclosure. Accordingly, the protection range of this disclosure shall control over the protection range of the claims.

What is claimed is:

1. A display substrate, comprising: a display area and a periphery area surrounding the display area; wherein the display substrate further comprises:
    a first signal line located at the periphery area, the first signal line comprising a portion extending in a first direction;
    a second signal line located at the periphery area, the second signal line comprising a portion extending in the first direction, wherein at least a portion of the first signal line is located between the display area and the second signal line, a first spacing region is provided between an orthographic projection of the first signal line onto a base of the display substrate and an orthographic projection of the second signal line onto the base;
    a first planarization layer, comprising a first planarization portion located at the periphery area; and
    a second planarization layer comprising a first via hole, an orthographic projection of the first via hole onto the base overlaps with the first spacing region at a first overlap region; and an orthographic projection of the first planarization portion onto the base overlaps with the first overlap region at a second overlap region;
    wherein the orthographic projection of the first via hole onto the base is located within the first spacing region;
    the orthographic projection of the first planarization portion onto the base at least partially overlaps with the orthographic projection of the first signal line onto the base; and
    a second spacing region is provided between the orthographic projection of the first planarization portion onto the base and the orthographic projection of the second signal line onto the base.

2. The display substrate according to claim 1, wherein the first overlap region is located inside the orthographic projection of the first planarization portion onto the base.

3. The display substrate according to claim 1, wherein a width d of the second spacing region in a direction perpendicular to the first direction satisfies: 8 µm≤d≤12 µm.

4. The display substrate according to claim 1, wherein the display substrate further comprises:
    an electrically conductive connecting layer extending from the display area to the periphery area, the electrically conductive connecting layer being coupled to the second signal line; wherein an orthographic projection of the electrically conductive connecting layer onto the base at least partially overlaps with the second overlap region.

5. The display substrate according to claim 4, wherein the second planarization layer further comprises a plurality of second via holes arranged in an array, and the electrically conductive connecting layer is coupled to the second signal line through the plurality of second via holes.

6. The display substrate according to claim 4, wherein the display substrate further comprises an anode layer, and the electrically conductive connecting layer and the anode layer are arranged in the same layer and formed of the same material.

7. The display substrate according to claim 4, wherein the display substrate further comprises an encapsulation layer, at least a portion of the encapsulation layer is located at a side of the electrically conductive connecting layer facing away from the base, and the encapsulation layer covers the second overlap region.

8. The display substrate according to claim 1, wherein the display substrate further comprises:
    a plurality of fan-out lines located at the periphery area, an orthographic projection of at least part of fan-out lines onto the base overlaps with the second overlap region.

9. The display substrate according to claim 1, wherein the first signal line comprises a first transmission portion and a second transmission portion coupled with each other, the first transmission portion extends in the first direction, at least a portion of the second transmission portion extends in a second direction, the second direction intersects with the first direction; and
    the second signal line comprises a third transmission portion and a fourth transmission portion coupled with each other, the third transmission portion extends in the first direction, at least a portion of the fourth transmission portion extends in the second direction, the fourth transmission portion and the second transmission portion are arranged along the first direction, the first spacing region is provided between an orthographic projection of the first transmission portion onto the base and an orthographic projection of the third transmission portion onto the base.

10. The display substrate according to claim 9, wherein the first transmission portion comprises a first transmission pattern and a second transmission pattern coupled with each other, the first transmission pattern is located between the base and the second transmission pattern;
    the third transmission portion comprises a third transmission pattern and a fourth transmission pattern coupled with each other, the third transmission pattern is located between the base and the fourth transmission pattern, the first spacing region is provided between an orthographic projection of the second transmission pattern onto the base and an orthographic projection of the fourth transmission pattern onto the base.

11. The display substrate according to claim 10, wherein the display substrate further comprises a first source-drain metal layer and a second source-drain metal layer, the first source-drain metal layer is located between the base and the second source-drain metal layer; and
    the first transmission pattern and the third transmission pattern are arranged in the same layer and formed by the same material as the first source-drain metal layer;
    the second transmission pattern and the fourth transmission pattern are arranged in the same layer and formed by the same material as the second source-drain metal layer.

12. The display substrate according to claim 11, wherein the second transmission portion comprises a fifth transmission pattern and a sixth transmission pattern that are stacked one on another, the fifth transmission pattern and the first transmission pattern are formed as an integral structure, a fourth spacing region is provided between the sixth transmission pattern and the second transmission pattern, and an orthographic projection of the fourth spacing region onto the base at least partially overlaps with an orthographic projection of a first border of the first planarization portion facing towards the third transmission portion onto the base.

13. The display substrate according to claim 11, wherein the display substrate further comprises:
 a third signal line located at the periphery area; the third signal line comprises a fifth transmission portion and a sixth transmission portion coupled with each other, the fifth transmission portion extends in the first direction, and at least a portion of the sixth transmission portion extends in the second direction; the sixth transmission portion and the second transmission portion are arranged along the first direction; and
 the orthographic projection of the first border of the first planarization portion facing towards the third transmission portion onto the base overlaps with an orthographic projection of the second transmission portion onto the base and an orthographic projection of the sixth transmission portion onto the base.

14. The display substrate according to claim 13, wherein the sixth transmission portion comprises a seventh transmission pattern, the seventh transmission pattern and the second transmission pattern are arranged in different layers.

15. The display substrate according to claim 14, wherein the sixth transmission portion comprises an eighth transmission pattern, the eighth transmission pattern is coupled to the seventh transmission pattern, and the eighth transmission pattern and the first transmission pattern are arranged in the same layer and formed by the same material.

16. The display substrate according to claim 13, wherein the first signal line comprises a positive power supply line, the second signal line comprises a negative power supply line, and the third signal line comprises an initialization signal line.

17. A display apparatus, comprising the display substrate according to claim 1.

18. A method of manufacturing a display substrate, the display substrate comprising a display area and a periphery area surrounding the display area; the method comprising:
 manufacturing a first signal line, the first signal line being located at the periphery area, and the first signal line comprising a portion extending in a first direction;
 manufacturing a second signal line, the second signal line being located at the periphery area, the second signal line comprising a portion extending in the first direction, wherein at least a portion of the first signal line is located between the display area and the second signal line, a first spacing region is provided between an orthographic projection of the first signal line onto a base of the display substrate and an orthographic projection of the second signal line onto the base;
 manufacturing a first planarization layer, the first planarization layer comprising a first planarization portion located at the periphery area; and
 manufacturing a second planarization layer, the second planarization layer comprising a first via hole, an orthographic projection of the first via hole onto the base overlaps with the first spacing region at a first overlap region; an orthographic projection of the first planarization portion onto the base overlaps with the first overlap region at a second overlap region;
 wherein the orthographic projection of the first via hole onto the base is located within the first spacing region;
 the orthographic projection of the first planarization portion onto the base at least partially overlaps with the orthographic projection of the first signal line onto the base; and
 a second spacing region is provided between the orthographic projection of the first planarization portion onto the base and the orthographic projection of the second signal line onto the base.

\* \* \* \* \*